(12) United States Patent
Tanaka

(10) Patent No.: US 7,576,389 B2
(45) Date of Patent: Aug. 18, 2009

(54) SEMICONDUCTOR DEVICE AND MANUFACTURE METHOD THEREOF

(75) Inventor: Yoshinori Tanaka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 62 days.

(21) Appl. No.: 11/808,163

(22) Filed: Jun. 7, 2007

(65) Prior Publication Data

US 2007/0296031 A1  Dec. 27, 2007

(30) Foreign Application Priority Data

Jun. 22, 2006  (JP) ................ 2006-172423

(51) Int. Cl.
*H01L 29/772* (2006.01)
*H01L 21/336* (2006.01)

(52) U.S. Cl. .......... 257/330; 257/296; 257/E29.13; 257/E21.409; 438/270

(58) Field of Classification Search ......... 257/213, 257/288, 296–313, 327, 329, 330, 334, E29.13, 257/E21.409; 438/142, 197, 238–256, 270, 438/271, 272
See application file for complete search history.

(56) References Cited

U.S. PATENT DOCUMENTS

| | | | |
|---|---|---|---|
| 5,686,329 A * | 11/1997 | Chang et al. | 438/253 |
| 6,124,622 A * | 9/2000 | Tsutsumi | 257/506 |
| 6,323,525 B1 | 11/2001 | Noguchi et al. | |
| 2004/0007728 A1 * | 1/2004 | Chang et al. | 257/301 |
| 2005/0275042 A1 | 12/2005 | Hwang et al. | |
| 2006/0017099 A1 * | 1/2006 | Paik | 257/330 |

FOREIGN PATENT DOCUMENTS

| | | |
|---|---|---|
| JP | 62-136877 | 6/1987 |
| JP | 03-087069 | 4/1991 |
| JP | 11-097674 | 4/1999 |
| JP | 11-307760 | 11/1999 |
| JP | 2003-023104 A | 1/2003 |
| JP | 2004-095745 A | 3/2004 |
| JP | 2005-045198 A | 2/2005 |
| JP | 2005-354069 A | 12/2005 |

* cited by examiner

*Primary Examiner*—Leonardo Andújar
*Assistant Examiner*—Kevin Quinto
(74) *Attorney, Agent, or Firm*—Foley & Lardner LLP

(57) ABSTRACT

The present invention provides a trench gate Tr having a first gate electrode and a second gate electrode in the inside of a groove. The first gate electrode is provided in a groove lower part defining a channel of the Tr with a gate oxide film interposed between the first gate electrode and the substrate. The second gate electrode is provided in a groove upper part facing a Tr impurity diffusion layer, with a gate oxide film and a groove side wall film interposed between the second gate electrode and the groove upper part. The provision of the composite film consisting of the gate oxide film and the groove side wall between gate electrode and the substrate in the groove upper part enables reduction of the parasitic capacitance of the gate electrode.

16 Claims, 15 Drawing Sheets

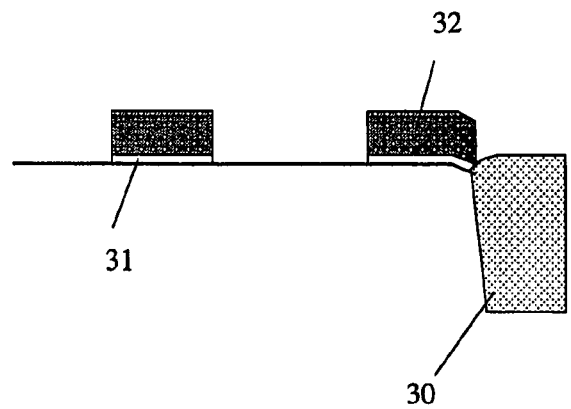
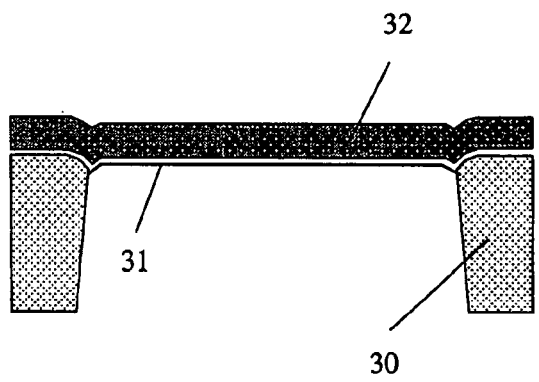
FIG. 5A  FIG. 5B
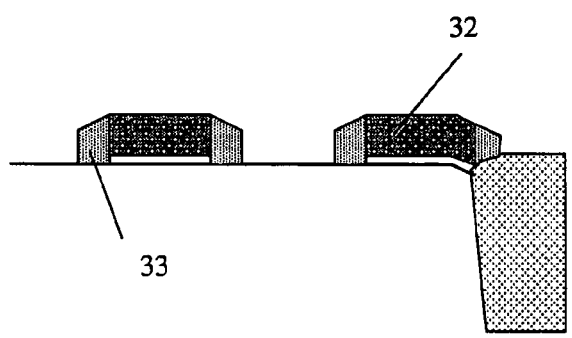
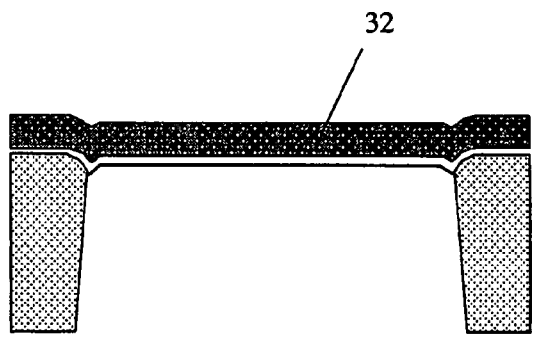
FIG. 6A  FIG. 6B

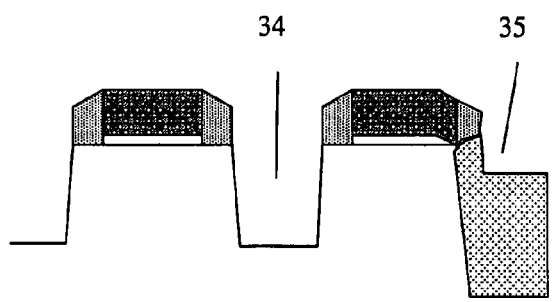 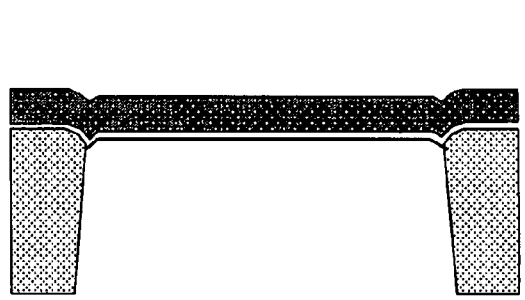
FIG. 7A     FIG. 7B
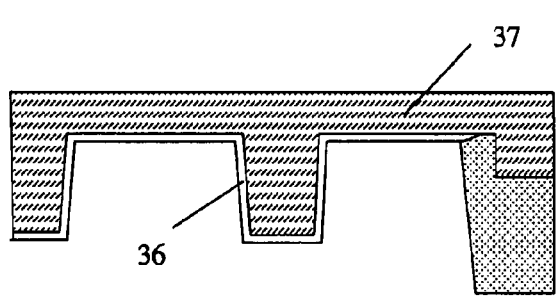 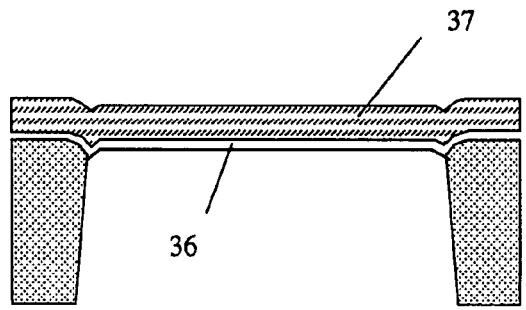
FIG. 8A     FIG. 8B

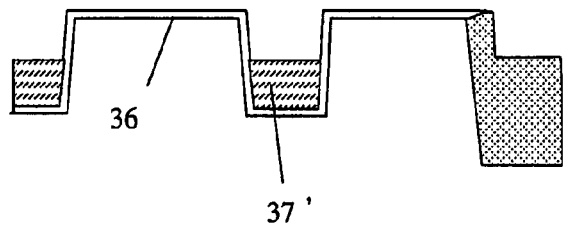
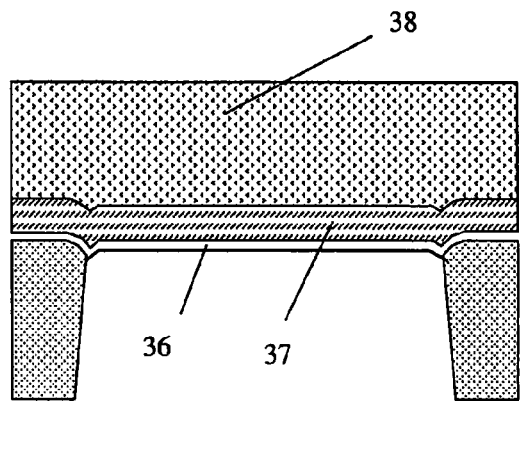
FIG. 9A  FIG. 9B
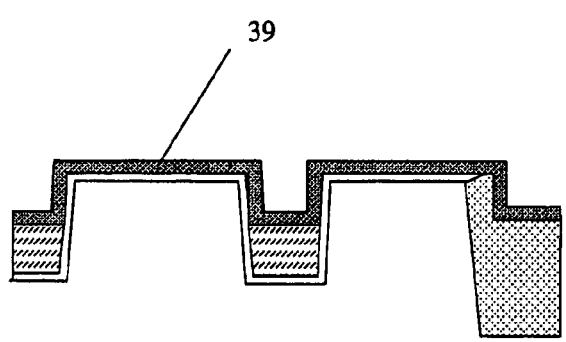
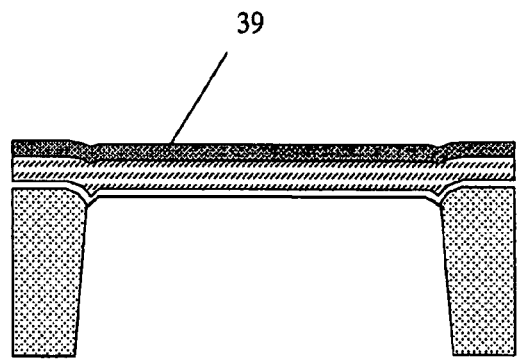
FIG. 10A  FIG. 10B

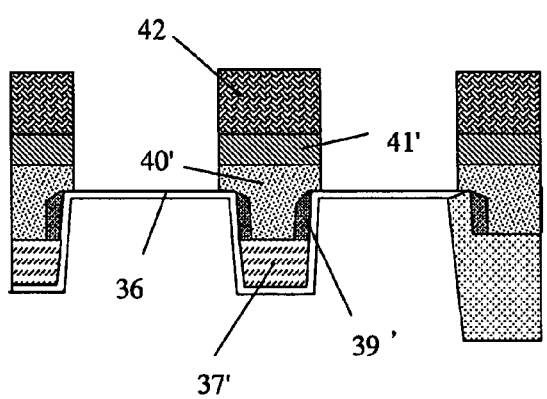 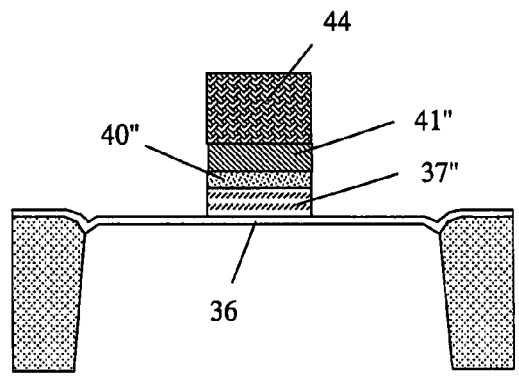
FIG. 13A  FIG. 13B
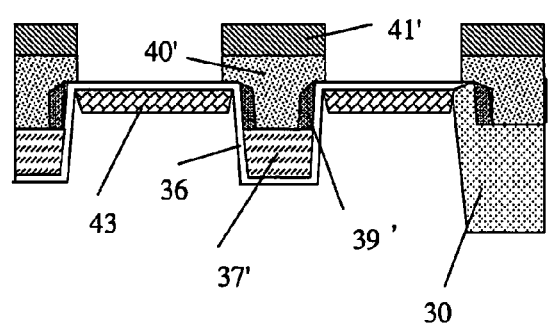 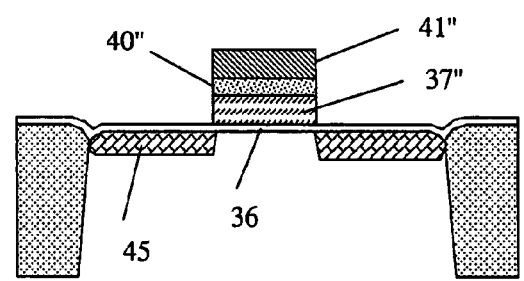
FIG. 14A  FIG. 14B

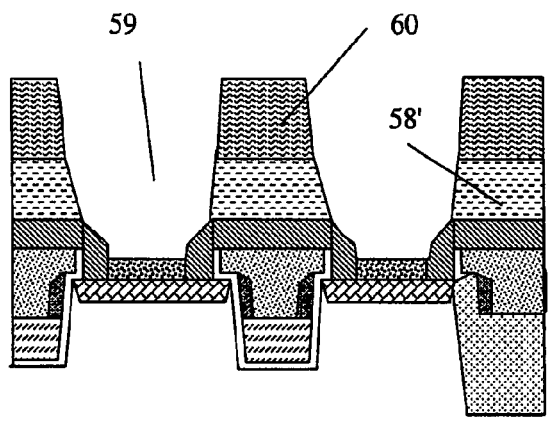
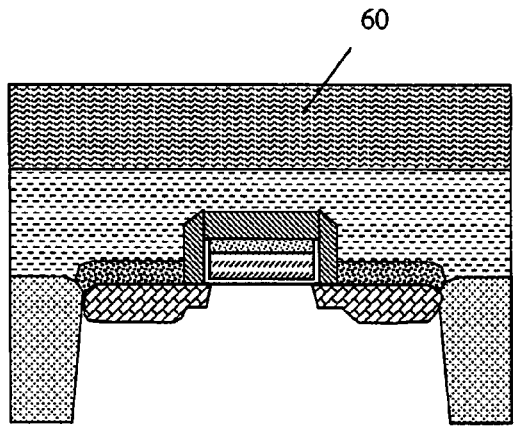
FIG. 17A          FIG. 17B
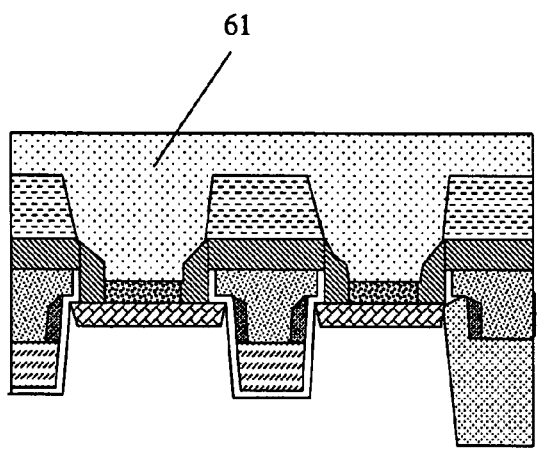
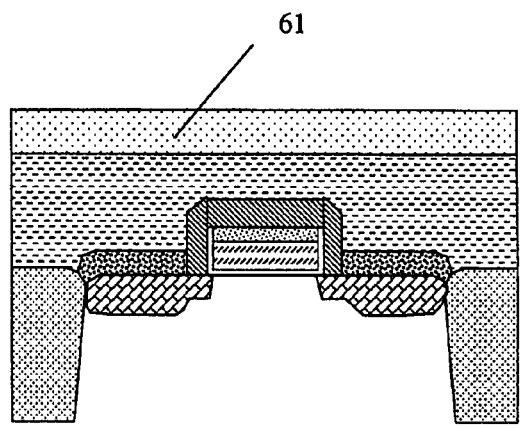
FIG. 18A          FIG. 18B

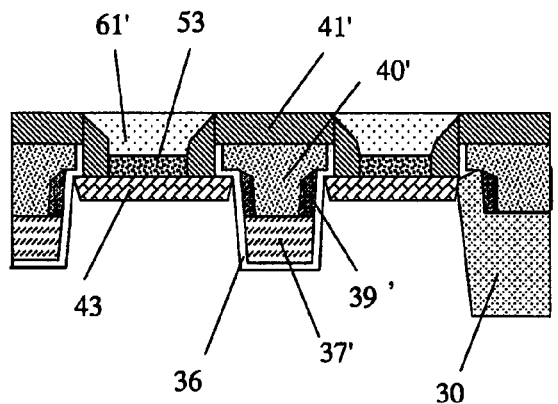 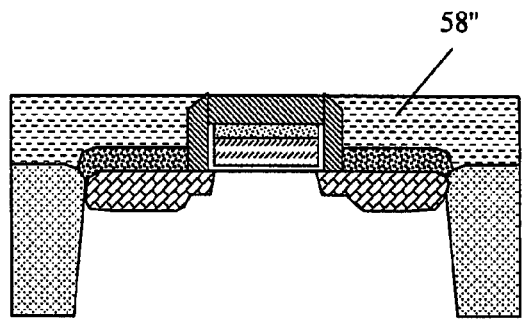
FIG. 19A          FIG. 19B
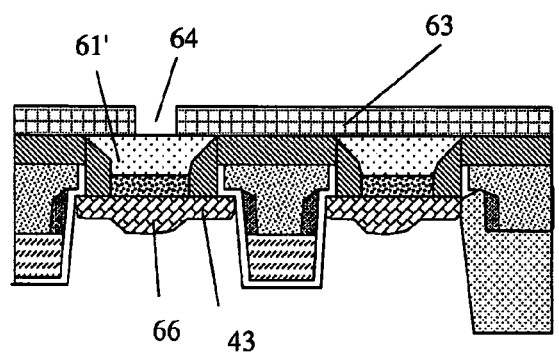 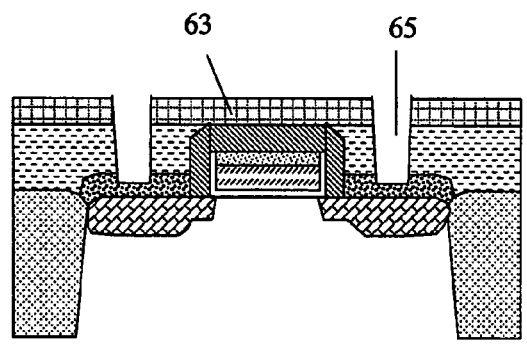
FIG. 20A          FIG. 20B

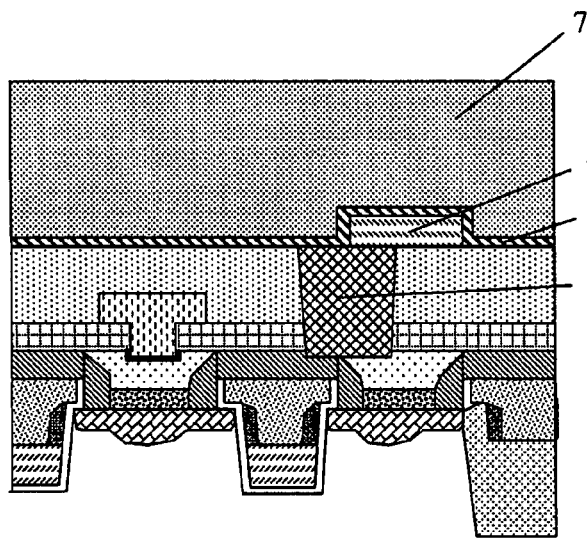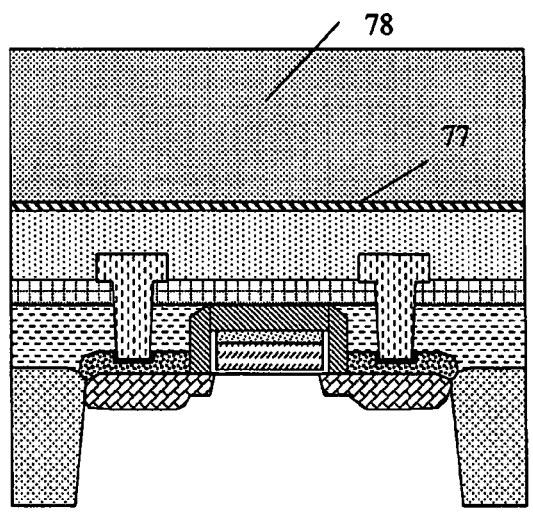
FIG. 23A          FIG. 23B
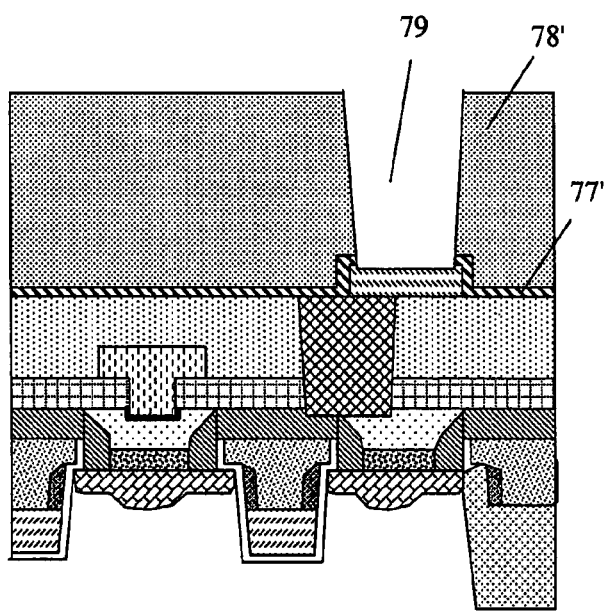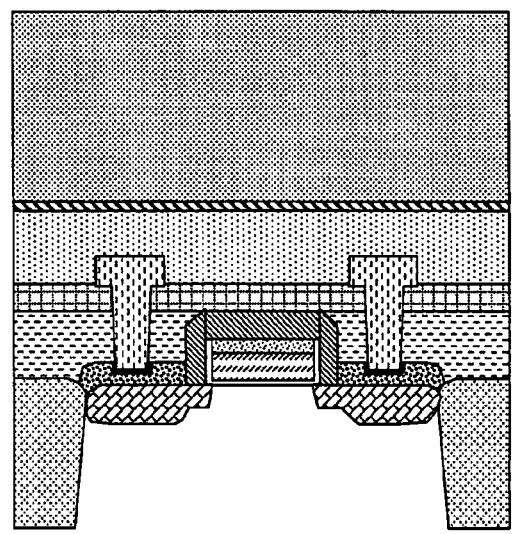
FIG. 24A          FIG. 24B

SEMICONDUCTOR DEVICE AND MANUFACTURE METHOD THEREOF

This application claims priority to prior application of JP 2006-172423, the disclosure of which is incorporated herein by reference.

BACKGROUND OF THE INVENTION

The present invention relates to a semiconductor device having a trench gate transistor and a manufacture method thereof.

Semiconductor devices have made progress very fast in density, characteristic, and the like. Among the semiconductor devices, a DRAM (Dynamic Random Access Memory) device has been remarkably advanced. Herein, it is to be noted that the DRAM device includes DRAM cells arranged in a memory cell region and peripheral circuits arranged in a peripheral region.

In such a DRAM device, the degree of integration of semiconductor elements, namely, DRAM cells has been increased substantially twice every one or two year. In order to achieve such high integration, the sizes of MOS (Metal-Oxide-Semiconductor) transistors have also been reduced. Such size reduction has entailed notable short-channel effects in the MOS transistors (hereafter, the term "transistor" would be simply abbreviated to "Tr").

In a large-capacity DRAM device, requirements have been made not only about reducing dimensions of memory cells but also about making the channel length of each transfer gate Tr short. Otherwise, the performance of the transfer gate Tr is deteriorated and, as a result, problems take place about deterioration in the retention or write characteristic of the DRAM memory cells. In the following description, the term "the transfer gate Tr of the memory cell" would be referred to as the "memory cell Tr".

As one of countermeasures against the short-channel effects in the memory cell Tr's, trench gate Tr's have been developed in which channels are formed in a three-dimensional structure. In such a trench gate Tr, a groove is formed in a semiconductor substrate and three-dimensional groove boundaries are used as channels to increase the channel length. A description will be made about a DRAM device using such trench gate Tr's (also referred to as RCAT (Recess Channel Access Transistors)), with reference to FIGS. 1 to 3.

Herein, it is to be noted that the DRAM device includes not only the memory cell Tr's but also peripheral circuit Tr's arranged in a peripheral circuit region adjacent to a memory cell region and both the memory cell Tr's and the peripheral circuit Tr's are manufactured in the same processes. Taking this into account, the following description will be directed to both the memory cell Tr' and the peripheral circuit Tr's for an understanding of the present invention.

FIG. 1 is a plan view of memory cell Tr's of the DRAM device, FIG. 2 is a plan view of peripheral circuit Tr's, and FIG. 3 is a cross-sectional view of the memory cell taken along line A-A' of FIG. 1.

As shown in FIG. 1, a plurality of active regions 1 are obliquely arranged and 2-bit memory cells are placed in each one active region 1. Thus, one-bit cell region has an area of $6F^2$. Specifically, a bit line contact is formed at a central part of each active region 1 and is connected to both a bit line 6 and a drain region formed in each active region. Source regions are formed in each active region on both sides of the bit line contact to provide two memory cell Tr's and are connected to capacitors through substrate contacts 5. A multiplicity of memory cells are repeatedly arranged in matrix while using in common bit lines 6 arranged transversely (in the X direction) and word lines (including gate electrodes) 2 arranged vertically (in the Y direction).

As shown in FIG. 1, an epitaxial layer 3 is selectively formed on a substrate surface defining the sources and the drains, and LDD side walls 4 are formed on side walls of each word line 2.

On the other hand, each of the peripheral circuit Tr's shown in FIG. 2 has, in the active regions 1, a word line 2 defining a gate electrode and source and drain diffusion layer regions. An epitaxial layer 3 is deposited on the diffusion layers. The diffusion layers are connected to other elements through substrate contacts 8 on the epitaxial layer 3. LDD side walls 4 are formed on the side walls of the word line 2.

Next, description will be made about a trench gate Tr that is shown in FIG. 3 and that is included in each memory cell. The illustrated memory cell has an isolation insulation film 10 for trench isolation, a groove 11, a gate oxide film 12, a gate electrode 13, a first conductive film layer 14 in the substrate contact, a low-concentration impurity diffusion layer 15, a high-concentration impurity diffusion layer 16, an insulation film mask (SiN, $Al_2O_3$ film) 17 on the gate electrode 13, a second conductive film layer 19 in the substrate contact, and a gate electrode side wall oxide film 20.

The trench gate Tr is capable of suppressing the short-channel effects of the Tr by forming the Tr channel part into a groove shape to increase the effective distance between the source and drain of the Tr. In this configuration of the trench gate Tr, however, an opposing area between the gate electrode 13 and the substrate becomes wide. This in turn increases the parasitic capacitance of the word line 2, entailing a problem of deterioration in its rise characteristics when the potential is turned ON. In some cases, the number of memory cells connected to each word line 2 must be reduced (that is, the length of each word line must be reduced), which results in an increase of a chip size.

Japanese Laid-Open Patent Publication No. 2004-95745 (Document D1) discloses a trench access transistor (TAT) which embeds a word line in a substrate. The trench access transistor disclosed in Document D1 has a trench and comprises a gate insulation film and a lower gate electrode formed on the gate insulation film in the trench. Specifically, the lower gate electrode is formed by a first conductive layer and a second gate electrode partially buried in the first conductive layer and partially projected from a top surface of the first gate electrode. Both the first and the second gate electrodes act as the word line buried in the substrate. In addition, a silicide layer is formed on the second gate electrode and is surrounded by a side wall insulator layer. Specifically, the first conductive layer is etched to a depth lower than the surface of the second conductive layer, whereby a groove is formed. The side wall insulator layer is formed in the groove, and the silicide layer is formed as an upper gate electrode. This configuration ensures a distance between the upper gate electrode and the gate insulation film. Moreover, the trench access transistor further has a channel diffusion layer under the bottom of the trench to provide a channel.

However, the trench access transistor disclosed in Document D1 is very complicate in structure and has a two-dimensional channel region. This is because the channel diffusion layer is confined under the bottom of the trench alone in Document D1.

Alternatively, Japanese Laid-Open Patent Publication No. 2005-354069 (Document D2) proposes an RCAT (Recess-Channel-Array Transistor), which has a channel defined by the groove formed in a substrate.

However, Document D2 neither teaches any problem entailing the RCAT nor discloses means for solving the problems of the RCAT.

SUMMARY OF THE INVENTION

It is an object of the present invention to provide a semiconductor device of a trench gate type, which can be reduced in size and which can avoid short-channel effects in the trench gate type Tr.

As described above, the short-channel effects of the memory cell Tr's have become more serious as the semiconductor device has been miniaturized.

Under the circumstances, a trench gate Tr has been developed to solve the problem of the short-channel effects, as mentioned in Documents D1 and D2. In the trench gate Tr, however, the opposing area between the gate electrode and the substrate becomes inevitably wide. This brings about increasing a parasitic capacitance of the gate electrode. Therefore, when the trench gate Tr is employed as a DRAM memory cell Tr, the parasitic capacitance of a word line including the gate electrode will inevitably increase. This may cause a problem of deterioration in the rise characteristics when the word line potential is turned ON. Thus, the number of memory cells connected to each word line must be reduced, which disadvantageously results in an increase of a chip size.

In view of these problems, it is an object of the present invention to provide a semiconductor device including a trench gate Tr the gate electrode of which has reduced parasitic capacitance, and a manufacture method of such a semiconductor device.

In order to solve the problems described above, the present invention basically employs the techniques described below. Obviously, various other applied techniques that can be envisaged without departing from the scope of the invention are also included in the present invention.

A semiconductor device of the present invention has a trench gate transistor which includes: a groove formed in a semiconductor substrate; a first gate electrode formed in a lower part of the groove with a gate insulation film interposed therebetween; side walls provided on inner walls in an upper part of the groove located upper than the first gate electrode; and a second gate electrode formed so as to be in contact with the side walls and a part of the top surface of the first gate electrode.

The first gate electrode of the semiconductor device according to the present invention is formed in a lower region of the groove defining a channel of the trench gate transistor.

The position of the top surface of the first gate electrode of the semiconductor device according to the present invention is lower than the bottom surface of an impurity diffusion layer on the substrate interface and higher than the distal end of a depletion layer formed in extension from the impurity diffusion layer.

The side walls of the semiconductor device according to the present invention are formed along the groove inner walls between the top surface of the first gate electrode and the substrate surface.

The first gate electrode of the semiconductor device according to the present invention is formed of a silicon film doped with an impurity.

The second gate electrode of the semiconductor device according to the present invention is formed of a conductive film including at least any one of a silicon film, a silicide film, a metal film, and a metal nitride film.

The side walls of the semiconductor device according to the present invention are formed of an insulation film including at least one of a silicon oxide film, a silicon nitride film, and a silicon oxynitride film.

The semiconductor device according to the present invention is a dynamic random access memory having the trench gate transistor used as a transfer gate transistor of a memory cell.

A manufacture method of a semiconductor device according to the present invention includes the steps of: forming a groove in a semiconductor substrate; forming a gate insulation film in the inside of the groove and on the semiconductor substrate; forming a first gate electrode in a lower part of the groove; forming side walls on the groove inner walls located upper than the first gate electrode; and forming a second gate electrode so as to be in contact with the side walls and a part of the top surface of the first gate electrode.

In the step of forming the first gate electrode of the manufacture method of the semiconductor device according to the present invention, a conductive film defining the electrode is etched away to leave a predetermined thickness of the film in the groove.

In the manufacture method of the semiconductor device according to the present invention, the first gate electrode is formed of a silicon film doped with an impurity.

In the manufacture method of the semiconductor device according to the present invention, the second gate electrode is formed of a conductive film including at least one of a silicon film, a silicide film, a metal film, and a metal nitride film.

In the manufacture method of the semiconductor device according to the present invention, the side walls are formed on an insulation film including at least one of a silicon oxide film, a silicon nitride film, and a silicon oxynitride film.

The semiconductor device according to the present invention is provided with a trench gate Tr having a first gate electrode and a second gate electrode. A gate oxide film and the first gate electrode are formed in a lower part of a groove of the trench gate Tr. The top surface of the first gate electrode is located lower than the bottom surface of an impurity diffusion layer on the substrate interface, and higher than the distal end of a depletion layer formed in extension from the impurity diffusion layer. Groove side walls are formed on upper inner walls of the groove located upper than the first gate electrode so as to expose a central part of the top surface of the first gate electrode. The second gate electrode is provided to be in contact with a part of the top surface of the first gate electrode. The provision of a composite film consisting of the gate oxide film and the groove side wall between the gate electrode and the substrate in the upper part of the groove has an effect of reducing the parasitic capacitance of the gate electrode. Further, when the trench gate Tr of the present invention is used as a DRAM memory cell Tr, a DRAM memory cell having desirable device characteristics can be obtained which is capable of reducing the parasitic capacitance in the gate electrode, that is, the parasitic capacitance in word lines, and thereby preventing the deterioration in ON characteristics of the memory cell Tr without increasing the chip size.

BRIEF DESCRIPTION OF THE DRAWINGS

FIGS. 5A and 5B are cross-sectional views showing a DRAM memory cell and a peripheral transistor, respectively, for explaining a manufacture method according to a first embodiment of the present invention in the sequence of process steps;

FIGS. 6A and 6B are cross-sectional views showing the DRAM memory cell and the peripheral transistor, respectively, for explaining the manufacture method according to the first embodiment of the present invention in the sequence of process steps;

FIGS. 7A and 7B are cross-sectional views showing the DRAM memory cell and the peripheral transistor, respectively, for explaining the manufacture method according to the first embodiment of the present invention in the sequence of process steps;

FIGS. 8A and 8B are cross-sectional views showing the DRAM memory cell and the peripheral transistor, respectively, for explaining the manufacture method according to the first embodiment of the present invention in the sequence of process steps;

FIGS. 9A and 9B are cross-sectional views showing the DRAM memory cell and the peripheral transistor, respectively, for explaining the manufacture method according to the first embodiment of the present invention in the sequence of process steps;

FIG. 10A and 10B are cross-sectional views showing the DRAM memory cell and the peripheral transistor, respectively, for explaining the manufacture method according to the first embodiment of the present invention in the sequence of process steps;

FIG. 13A and 13B are cross-sectional views showing the DRAM memory cell and the peripheral transistor, respectively, for explaining the manufacture method according to the first embodiment of the present invention in the sequence of process steps;

FIG. 14A and 14B are cross-sectional views showing the DRAM memory cell and the peripheral transistor, respectively, for explaining the manufacture method according to the first embodiment of the present invention in the sequence of process steps;

FIGS. 17A and 17B are cross-sectional views showing the DRAM memory cell and the peripheral transistor, respectively, for explaining the manufacture method according to the first embodiment of the present invention in the sequence of process steps;

FIGS. 18A and 18B are cross-sectional views showing the DRAM memory cell and the peripheral transistor, respectively, for explaining the manufacture method according to the first embodiment of the present invention in the sequence of process steps;

FIGS. 19A and 19B are cross-sectional views showing the DRAM memory cell and the peripheral transistor, respectively, for explaining the manufacture method according to the first embodiment of the present invention in the sequence of process steps;

FIGS. 20A and 20B are cross-sectional views showing the DRAM memory cell and the peripheral transistor, respectively, for explaining the manufacture method according to the first embodiment of the present invention in the sequence of process steps;

FIGS. 23A and 23B are cross-sectional views showing the DRAM memory cell and the peripheral transistor, respectively, for explaining the manufacture method according to the first embodiment of the present invention in the sequence of process steps;

FIGS. 24A and 24B are cross-sectional views showing the DRAM memory cell and the peripheral transistor, respectively, for explaining the manufacture method according to the first embodiment of the present invention in the sequence of process steps;

DESCRIPTION OF THE PREFERRED EMBODIMENTS

Exemplary embodiments of a semiconductor device and a manufacture method thereof according to the present invention will be described with reference to the accompanying drawings.

Figure 1:
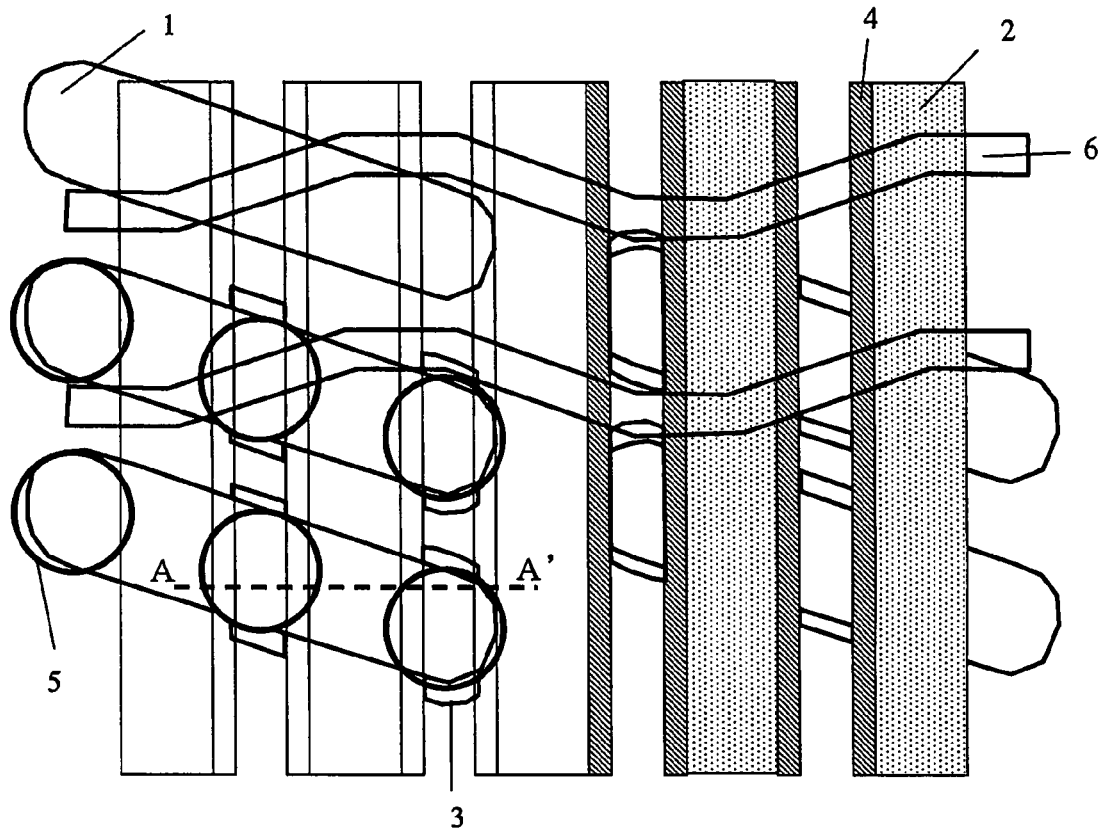
FIG. 1 is a plan view of DRAM memory cells.
Figure 2:
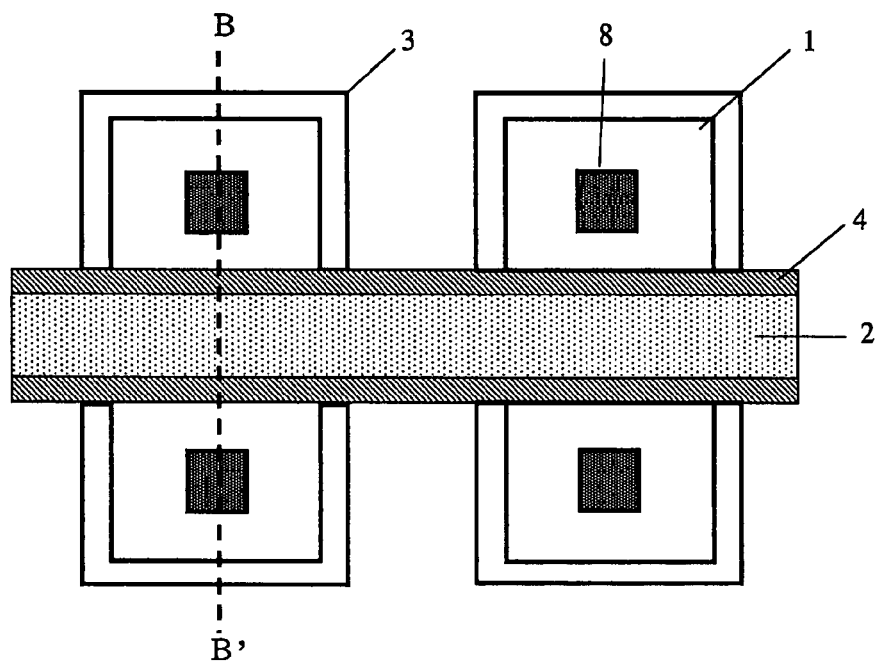
FIG. 2 is a plan view of peripheral circuit transistors.
Figure 3:
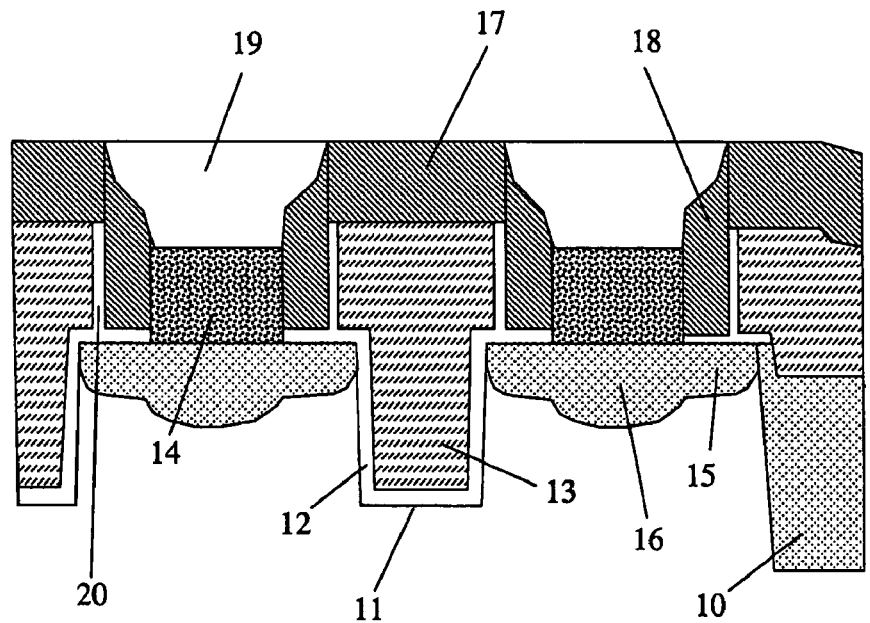
FIG. 3 is a cross-sectional view of a DRAM memory cell according to a related art.
Figure 4:
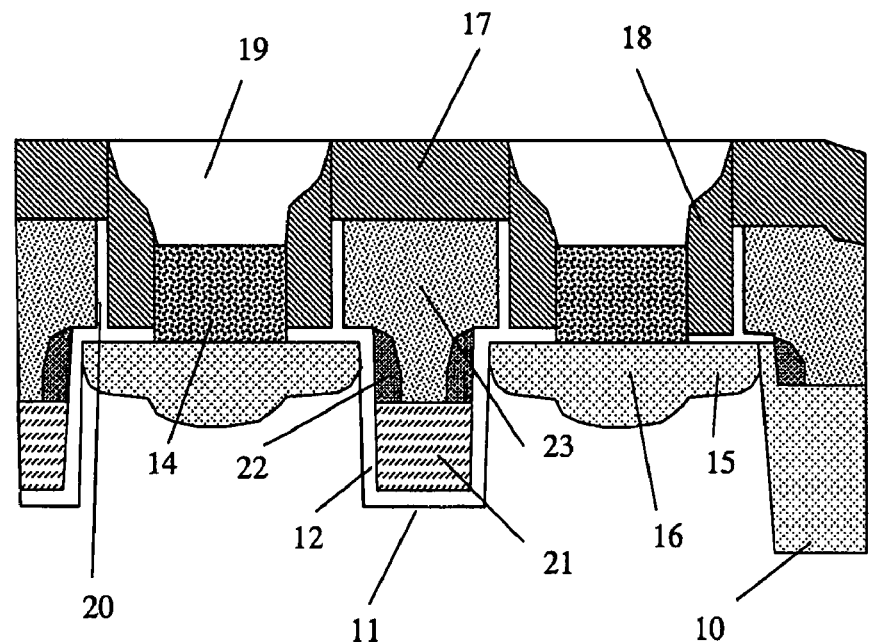
FIG. 4 is a cross-sectional view of a DRAM memory cell according to the present invention.

A semiconductor device according to a first embodiment of the invention can be specified by a DRAM memory cell and peripheral circuit Tr's as shown in FIGS. 1 and 2, respectively, but is different from FIG. 3 in a sectional view of the DRAM memory cell, as shown in FIG. 4 taken along a line A-A' of FIG. 1. This is because the plan views of FIG. 1 and FIG. 2 show basic configurations, and these configurations are also applicable to the present invention also.

In FIG. 4, a trench gate Tr is illustrated and includes a groove 11 provided in a silicon substrate, a gate oxide film 12 formed on a portion including an inside surface of the groove 11, and a first gate electrode 21 formed on a part of the gate oxide film 12 located in the groove 11. Thus, the gate oxide film 12 is interposed between the silicon substrate and the first gate electrode 21. The first gate electrode 21 has a top surface lower than that of the silicon substrate. Preferably, the top surface of the first gate electrode 21 is located at a height or level lower than the bottom surface of an impurity diffusion layer on the substrate interface and higher than a distal end or a farthest end of a depletion layer extended from the impurity diffusion layer.

As shown in FIG. 4, a groove side wall 22 is partially contacted with the top surface of the first gate electrode 21 and is further contacted with an upper inner side wall of the groove 11, with an upper portion of the gate oxide film 12 interposed between the upper inner side wall of the groove 11 and an upper portion of the groove side wall 22. In addition, the groove side wall 22 exposes a center part of the top surface of the first gate electrode 21. In other words, the groove side walls 22 are opened at a central part thereof.

A second gate electrode 23 is formed so as to be in contact with the groove side wall 22 and the center part of the top surface of the first gate electrode 21. The other components of the configuration are the same as those shown in FIG. 3. Therefore, they are labeled with the same reference numerals and the description thereof will be omitted here.

Thus, the trench gate Tr according to the exemplary embodiment of the present invention is featured by having the first gate electrode 21 and the second gate electrode 23. A region provided within the substrate in the lower part of the groove 11 serves as a channel which is defined by the first gate electrode 21 and the thin gate oxide film interposed between the first gate electrode 21 and the substrate. The second gate electrode 23 is provided in a region in the upper part of the groove 11 contacted with the source/drain impurity diffusion layers, with the gate oxide film 12 and the groove side wall 22 interposed between the second gate electrode 23 and the source/drain impurity diffusion layers. In this manner, the groove region other than the channel region is formed as a multilayer insulation film composed of the gate oxide film 12 and the groove side wall 22. Such a multilayer insulation film serves to reduce parasitic capacitance of the gate electrode and makes it possible to obtain a transistor which has excellent characteristics.

As mentioned before, although the exemplary embodiment of the present invention is featured by the DRAM memory cell (may be simply called a memory cell), the DRAM memory cell and the peripheral circuit Tr are simultaneously manufactured through the same processes. Therefore, the following description will be directed to processes or steps of manufacturing both the DRAM cell and the peripheral circuit Tr with reference to FIGS. 5 to 26. Specifically, FIGS. 5A to 26A are cross-sectional views of a memory cell region (for the DRAM memory cell) taken along line A-A' of FIG. 1, while FIGS. 5B to 26B are cross-sectional views of a peripheral region (for the peripheral circuit Tr's) taken along line B-B' of FIG. 2. The processes shown in FIGS. 5A to 26A are performed simultaneously with those of FIGS. 5B to 26B, respectively.

Under the circumstances, a manufacturing method according to the first exemplary embodiment of the invention will be described in the sequence of steps, with reference to the cross-sectional views of FIGS. 5 to 26. In this exemplary embodiment of the present invention, the memory cell Tr is provided by a trench gate Tr formed on the memory cell region, while the peripheral circuit Tr is provided by an ordinary Tr which is different in structure from the trench gate Tr and which is formed on the peripheral region.

As shown in FIGS. 5A and 5B, trenches are at first formed on a silicon substrate to define active regions on the silicon substrate. A trench insulation film 30 is formed on the silicon substrate by an STI (Shallow Trench Isolation) method to embed the trenches. Thus, the active regions are dielectrically isolated from each other.

Next, a thermal oxidation film 31 is formed over the entire surface of the silicon substrate by a thermal oxidation method at a temperature of about 750 to 1100° C. A silicon nitride film (hereafter, referred to as the "SiN film") 32 is further deposited thereon by a CVD (Chemical Vapor Deposition) method. As a result, the thermal oxidation film 31 and the SiN film 32 are patterned in the memory cell region and are left as laminated patterns composed of the thermal oxidation film 31 and the SiN film 32, in desired regions in the memory cell region, as illustrated in FIG. 5. On the other hand, the thermal oxidation film 31 and the SiN film 32 are not patterned on the peripheral region, as shown in FIG. 5B.

Furthermore, an SiN film is deposited by a CVD method to cover the laminated patterns of the thermal oxidation film 31 and the SiN film 32. Thereafter, anisotropic etching such as RIE is performed to selectively remove the SiN film from the memory cell region and to remove a whole of the SiN film from the peripheral region. In consequence, SiN film side walls 33 alone are left on the side walls of the laminated patterns, as shown in FIG. 6A. As illustrated in FIG. 6A, the silicon substrate and the trench insulation film 30 are partially exposed on the memory cell region while the silicon substrate is not exposed on the peripheral region, as shown in FIG. 6B.

As shown in FIG. 7A, the silicon substrate portion uncovered with the SiN film side walls 33 and the laminated film of the thermal oxidation film 31 and the SiN film 32 on the memory cell region are subjected to anisotropic dry etching such as RIE together with the trench insulation film 30. Thus, a groove 34 is formed on the memory cell region to define a channel region of the trench gate Tr. The trench insulation film 30 is selectively etched to form a groove 35 in a part of the STI region. On the other hand, no etching is performed on the peripheral region, as shown in FIG. 7B.

The SiN film 32 and the SiN film side walls 33 which are used as a mask for the formation of the groove 34 of the trench gate Tr are removed with the use of a phosphate solution at about 100 to 200° C. Thus, the SiN film 32 are removed from the memory cell region and the peripheral region. Subsequently, the exposed thermal oxidation film 31 is then removed by the use of a hydrofluoric acid (HF) solution from the memory cell region and the peripheral region to expose the silicon substrate on the memory cell region and the peripheral region. After the silicon substrate is pretreated with acid and alkaline solutions, thermal oxidation is performed at 750 to 1100° C. to form an oxide film with a thickness of 10 nm or less, and the oxide film is removed with an HF solution. After pretreatment is performed by acid and alkaline solutions again, thermal oxidation is performed at 750 to 1100° C. to form a gate oxide film 36, as shown in FIGS. 8A and 8B. Subsequently, a first gate conductive film 37 of a silicon film doped with an impurity is deposited by a CVD method at a temperature of about 500 to 600° C. Thus, the gate oxide film 36 and the first gate conductive film 37 are deposited on the memory cell region and the peripheral region, as shown in FIGS. 8A and 8B.

Next, a resist film is coated on the first gate conductive film 37 of the memory cell region and the peripheral region. The resist film is selectively patterned on the memory cell region while the resist film 38 is left on the peripheral region without any etching, as shown in FIG. 9B. The first gate conductive film 37 on the memory cell region is selectively and partially etched by plasma dry etching with the resist film 38 left on the peripheral region. Thus, a first gate electrode 37' is provided by a part of the first gate conductive film 37. Specifically, the first gate electrode 37' is located on the gate oxide film 36 and is left only on a bottom portion of the groove 34, in a manner shown in FIG. 9A.

Preferably, the top surface of the first gate electrode 37' is located at a level or height which is lower than the bottom surface of the impurity diffusion layer on the substrate interface, and which is higher than the distal end of a depletion layer which is extended from the impurity diffusion layer. Specifically, the height of the first gate electrode 37' is defined to be within the depletion layer region on the substrate side. With this structure, the substrate region functioning as a Tr channel on the substrate interface can be covered efficiently. If the height of the first gate electrode 37' is too low, the Tr is rendered into an offset state, whereas if it is too high, the effect of reducing the parasitic capacitance is deteriorated.

Figure 11A:
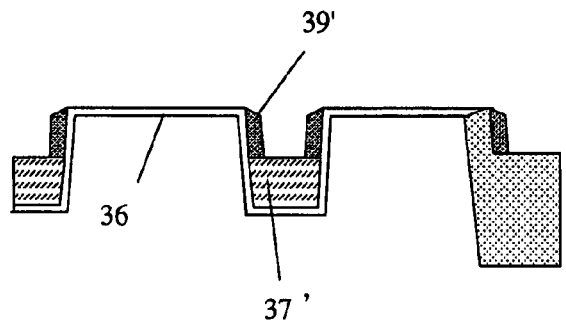
FIGS. 11A and 11B are cross-sectional views showing the DRAM memory cell and the peripheral transistor, respectively, for explaining the manufacture method according to the first embodiment of the present invention in the sequence of process steps.
Figure 11B:
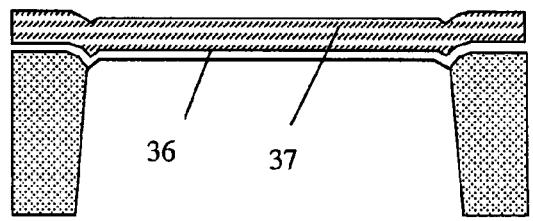

A silicon oxide film, an SiN film, a silicon oxynitride film (SiON film), or a laminated film thereof is deposited by a CVD method on the entire surface of the silicon substrate and serves as a groove side wall film 39, as shown in FIGS. 10A and 10B. The entire surface of the deposited groove side wall film 39 is subjected to anisotropic dry etching by RIE. This anisotropic dry etching process forms groove side walls 39' consisting of the groove side wall film 39 on the upper inner walls of the groove where the first gate electrode 37' is not formed. Thus, a central part of the groove side wall film 39 is selectively removed to expose the top surface of the first gate electrode 37' as shown in FIG. 11A. The groove side walls 39' are formed on the part of the groove inner walls extending between the top surface of the first gate electrode 37' and the substrate surface. On the other hand, the groove side wall film 39 is completely etched from the peripheral region by the anisotropic dry etching and the first gate conductive film 37 is left on the first oxide film 36 of the peripheral region, as shown in FIG. 11B.

Figure 12A:
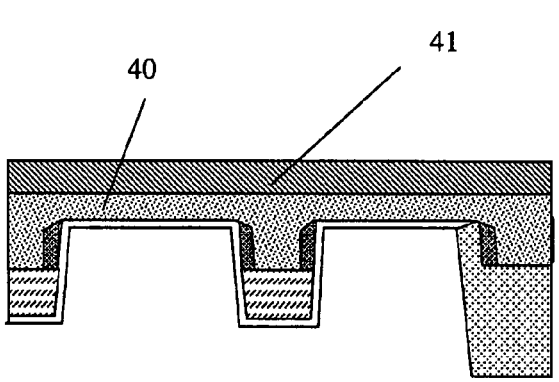
FIG. 12A and 12B are cross-sectional views showing the DRAM memory cell and the peripheral transistor, respectively, for explaining the manufacture method according to the first embodiment of the present invention in the sequence of process steps.
Figure 12B:
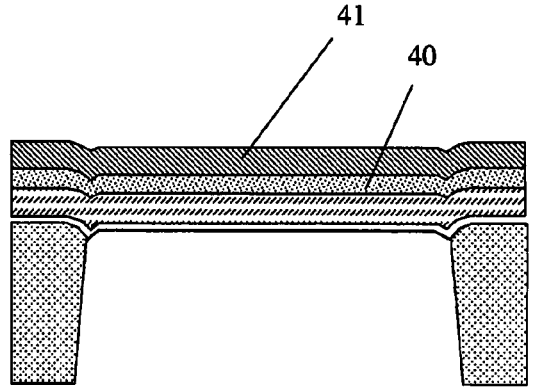

A silicon film is deposited by a CVD method to provide a second gate conductive film 40 contacted with the surface of the first gate electrode 37' or the first gate conductive film 37, as shown in FIGS. 12A and 12B. In place of the silicon film, a silicide film, a metal film such as W or Ti, a metal nitride film, or a laminated film thereof may be used for the second gate conductive film 40.

In this event, the peripheral region thus has a structure such that the first gate electrode 37 and these conductive films 40 are completely laminated or stacked.

As shown in FIGS. 12A and 12B, an insulation film 41 made of an SiN film, an oxide film, a laminated film thereof, or a metal oxide film such as an aluminum oxide ($AL_2O_3$) film is deposited on the second gate conductive film 40 by a CVD or sputtering method.

Subsequently, a resist film is coated on the insulation film 41 and is subjected to patterning. Thus, resist patterns 42 and 44 are formed in desired portions of the memory cell region and the peripheral region. Under the circumstances, anisotropic dry etching such as RIE is performed to form an insulation film hard mask 41' and a second gate electrode 40' in the memory region (see FIG. 13A), and to form an insulation film hard mask 41", a second gate electrode 40" and a first gate electrode 37" in the peripheral region (see FIG. 13B).

By using these gate electrodes as masks, impurity ions are implanted at a dose of about 1e12 to 5e14 $cm^{-2}$. Annealing is then performed at a temperature of 900 to 1100° C. to activate the impurity diffusion layer. Low-concentration impurity diffusion layers 43 and 45 are formed to provide sources and drains of the memory cell Tr and the peripheral circuit Tr (as shown in FIGS. 14A and 14B).

In order to remove any damages to the substrate caused by the gate etching, the side walls of the gate electrodes 40'; and 37" and 41" are oxidized in a lamp apparatus or furnace at a temperature of about 750 to 1100° C. When a metal film or a metal nitride film is used for the second gate electrode, appropriate selective oxidation conditions should be used such that only the silicon film is oxidized without any oxidation of the metal film or the metal nitride film. In any event, portions of the gate oxide film 36 exposed in FIGS. 14A and 14B are removed from the memory cell region and the peripheral region.

Figure 15A:
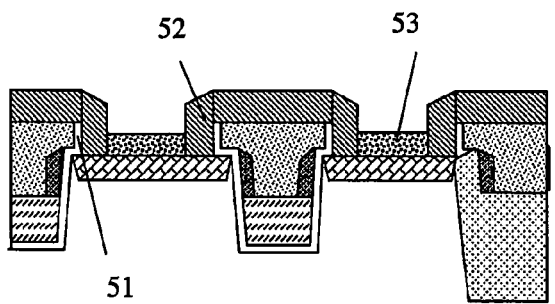
FIGS. 15A and 15B are cross-sectional views showing the DRAM memory cell and the peripheral transistor, respectively, for explaining the manufacture method according to the first embodiment of the present invention in the sequence of process steps.
Figure 15B:
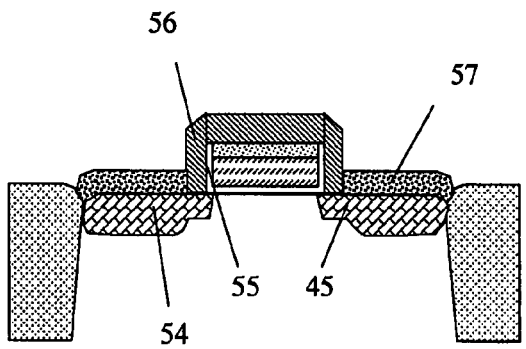

As shown in FIGS. 15A and 15B, side wall oxide films 51 and 55 are formed on the gate electrodes of the memory cell Tr and the peripheral circuit Tr, respectively. Subsequently, LDD side walls 52 and 56 composed of an SiN film, an oxide film or a laminated film thereof, or a metal oxide film such as an $Al_2O_3$ film are formed on the sides of the gate electrodes. Further, selective epitaxial layers 53 and 57 are formed on regions of the silicon substrate surface surrounded by the LDD side walls 52, 56 and the trench isolation insulation film 30.

Furthermore, high-concentration impurity ions are again implanted at a dose of about 1e15 to 1e16 $cm^{-2}$ at the peripheral region to form a high-concentration impurity diffusion layer 54 in the impurity diffusion layer region 45 of the peripheral region (see FIG. 15B).

Figure 16A:
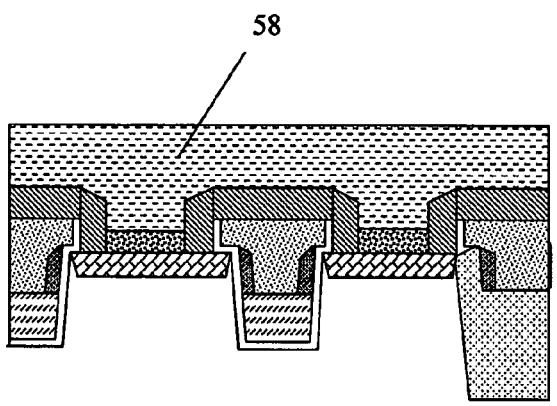
FIGS. 16A and 16B are cross-sectional views showing the DRAM memory cell and the peripheral transistor, respectively, for explaining the manufacture method according to the first embodiment of the present invention in the sequence of process steps.
Figure 16B:
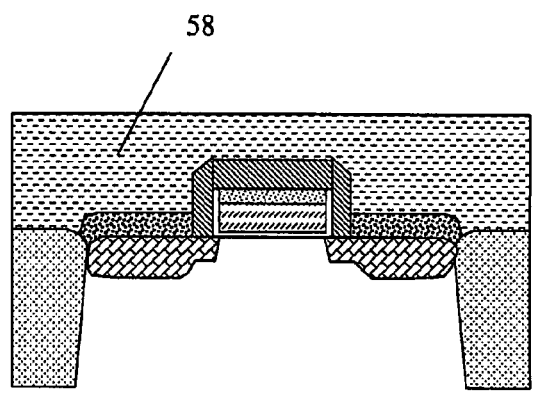

As shown in FIGS. 16A and 16B, an interlayer insulation film 58 made of a silicon oxide film doped with boron (B) and phosphorus (P) (Boron Phosphorous Silicate Glass, or BPSG) is deposited on the memory cell region and the peripheral region by a CVD method. Thereafter, the BPSG film is fluidized and flattened by a heat treatment and is further flattened by a polishing treatment, such as a CMP (Chemical Mechanical Polishing) method.

Next, a resist film 60 is coated on the memory cell region and the peripheral region, as illustrated in FIGS. 17A and 17B. Thereafter, a substrate contact hole 59 is formed on the selective epitaxial layers 53 and the interlayer insulation film 58 is patterned into a patterned film 58', as shown in FIG. 17A by performing anisotropic dry etching such as RIE with the resist pattern 60 used as a mask in a desired region of the memory cell region. Thereafter, the resist pattern 60 is removed.

As shown in FIGS. 18A and 18B, a conductive film 61 of silicon doped with an impurity is deposited on the memory cell region and the peripheral region. In this event, the conductive film 61 on the memory cell region is contacted with the surfaces of the selective epitaxial layers 53 through the substrate contact holes 59 (see FIG. 18A). On the other hand, the conductive film 61 on the peripheral region is not contacted with the epitaxial layers 57, as shown in FIG. 18B.

The conductive film 61 is then etched back on the memory cell region and the peripheral region by anisotropic dry etching such as RIE, or CMP, or a combined process thereof. As a result, the conductive film 61 is selectively left as a contact plug 61' in the inside of the substrate contact of the memory cell, as shown in FIG. 19A. In this event, the interlayer insulation film 58 is also etched back together with the conductive film 61 until the surface of the insulation film hard mask 41' and 41" are exposed on the memory cell region and the peripheral region, as shown in FIGS. 19A and 19B. On the peripheral region, an interlayer insulation film 58" is selectively left and surrounds the insulation film hard mask 41" as shown in FIG. 19B.

As illustrated in FIGS. 20A and 20B, an interlayer insulation film 63 of silicon oxide is deposited by a CVD method on an exposed entire surface of the memory cell region and the peripheral region. A bit line contact hole 64 is formed on the interlayer insulation film 63 of the memory cell region by anisotropic dry etching such as RIE within the contact plug 61' interposed between the memory cell Tr's (see FIG. 20A). At the same time, contact holes 65 are formed on the interlayer insulation film 63 of the peripheral region and reach the selective epitaxial layer 57 through the interlayer insulation film 58". The contact holes 65 are located at positions corresponding to the source/drain regions formed on the peripheral region. In FIG. 20A, high-concentration impurity diffusion layers 66 are formed in the source/drain regions of the memory cell Tr's by diffusing impurity through the contact plug 61' (as shown in FIG. 20A).

Figure 21A:
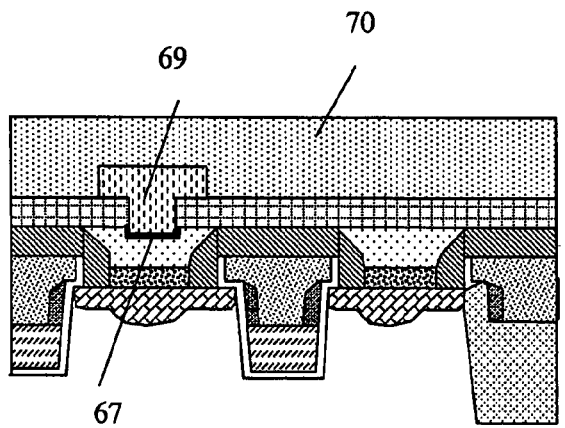
FIGS. 21A and 21B are cross-sectional views showing the DRAM memory cell and the peripheral transistor, respectively, for explaining the manufacture method according to the first embodiment of the present invention in the sequence of process steps.
Figure 21B:
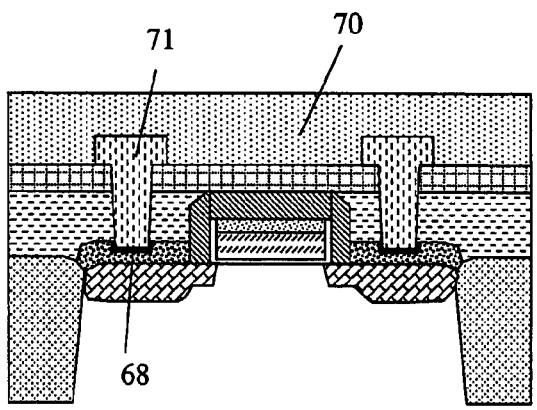

Thereafter, metal wirings 69 and 71 of W, Ti, TiN, Al or the like are formed on the memory cell region and the peripheral region, as shown in FIGS. 21A and 21B. Such metal wirings serve as bit lines of the DRAM memory cells. During this formation, metal silicide films 67 and 68 of CoSi, TiSi, WSi or the like may be formed in interfaces between the metal wirings and the substrate contact plug 61' of the memory cell region and interfaces between the metal wirings and the selective epitaxial layers 57 of the peripheral region, respectively, as illustrated in FIGS. 21A and 21B. In the illustrated example, an interlayer insulation film 70 composed of an SiN film or a silicon oxide film, or a laminated film thereof is deposited by a CVD method to cover the entire surface of the memory cell region and the peripheral region. After deposition, the interlayer insulation film 70 is flattened by CMP.

Figure 22A:
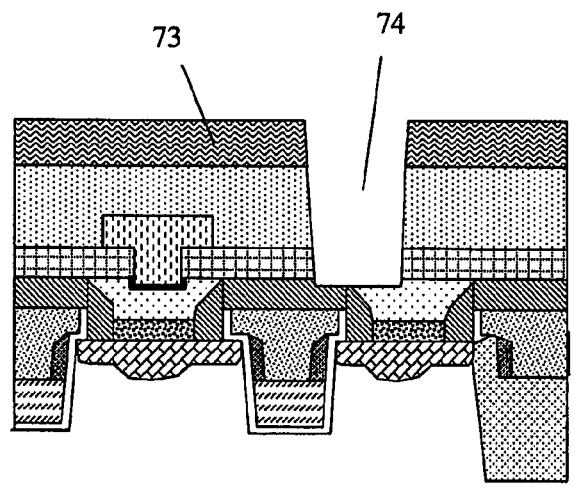
FIGS. 22A and 22B are cross-sectional views showing the DRAM memory cell and the peripheral transistor, respectively, for explaining the manufacture method according to the first embodiment of the present invention in the sequence of process steps.
Figure 22B:
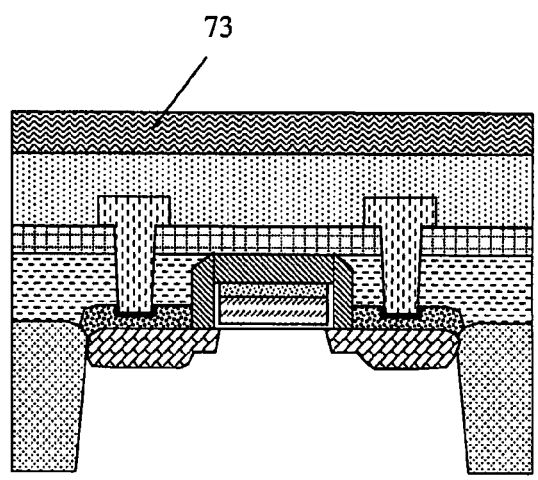

In FIGS. 22A and 22B, a resist pattern 73 is formed on the interlayer insulation film 70. By using the resist pattern 73 as a mask, a contact hole 74 is formed on the memory cell region by anisotropic dry etching by an RIE method so as to contact with the other contact plug on the memory cell region (see FIG. 22A). After forming the contact hole 74, the resist pattern 73 is entirely removed from the memory cell region and the peripheral region.

As shown in FIGS. 23A and 23B, a conductive plug 75 composed of a silicon film doped with an impurity, a metal film such as Ti, TiN, W or the like, a metal nitride film, or a composite film thereof is formed in the inside of the contact hole 74. Thus, the contact plug 75 is embedded within the contact hole 75, as shown in FIG. 23A. In the illustrated example, a conductive plug lead-out pad 76 is formed of a similar material to that of the conductive plug 75 at a position offset from the center of the conductive plug 75. Further, an interlayer insulation film 77 of SiN and a silicon oxide film 78 are successively deposited on the memory cell region and the peripheral region by a CVD method, as shown in FIGS. 23A and 23B. Thus, the conductive plug lead-out pad 76 is covered with the interlayer insulation film 77 and the silicon oxide film 78 (see FIG. 23A).

Thereafter, the interlayer insulation film 78 is selectively etched on the memory cell region as shown in FIG. 24A to form a contact hole 79 for formation of a capacitor. Thus, the interlayer insulation film 78 is left on the memory cell region as a partially removed insulation film 78' while the interlayer insulation film 78 is left without being etched, as shown in FIG. 24B. The contact hole 79 is formed at such a position that the center of the contact hole 79 substantially coincides with the center of the conductive film pad 76 (see FIG. 24A).

Figure 25A:
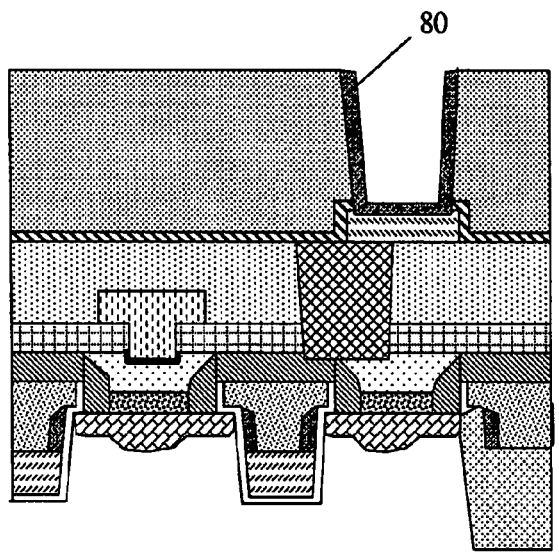
FIGS. 25A and 25B are cross-sectional views showing the DRAM memory cell and the peripheral transistor, respectively, for explaining the manufacture method according to the first embodiment of the present invention in the sequence of process steps.
Figure 25B:
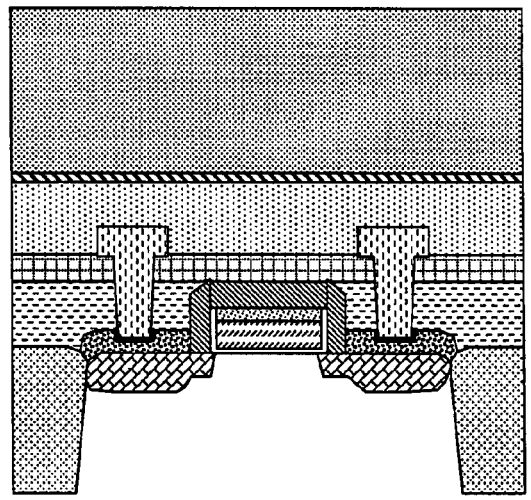

As shown in FIG. 25A, a capacitor lower electrode 80 is formed to cover the inner wall surface of the contact hole 79 and is contacted with the conductive film pad 76. The capacitor lower electrode 80 may be formed by a silicon film, a metal film of W, Ti, Pt, Ru or the like, a nitride film of any of these metals, or a laminated film thereof. At any rate, the capacitor lower electrode 80 may be deposited by a CVD method and is then left within the inside of the contact hole 79 by CMP or anisotropic dry etching such as RIE. Such a capacitor lower electrode is not left on the peripheral region, as shown in FIG. 25B.

Subsequently, a capacitor insulation film 81 of $Ta_2O_5$, $Al_2O_3$, HfO, or ZrO, or a laminated or mixed film thereof is deposited on the capacitor lower electrode 80 only on the memory cell region, as readily understood from FIGS. 26A and 26B.

Figure 26A:
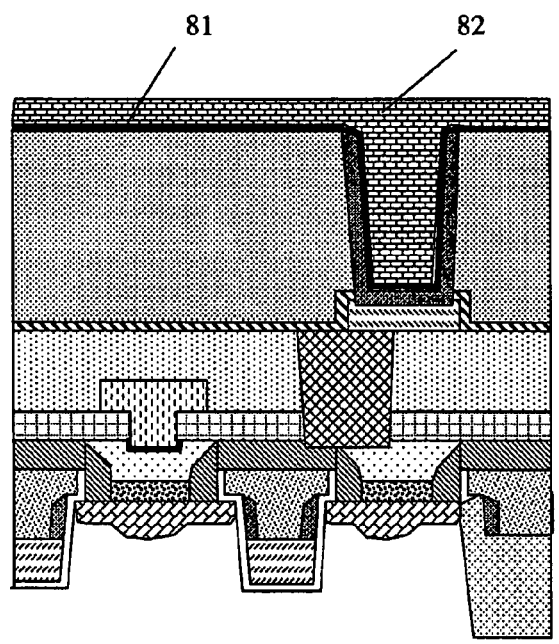
FIGS. 26A and 26B are cross-sectional views showing the DRAM memory cell and the peripheral transistor, respectively, for explaining the manufacture method according to the first embodiment of the present invention in the sequence of process steps.
Figure 26B:
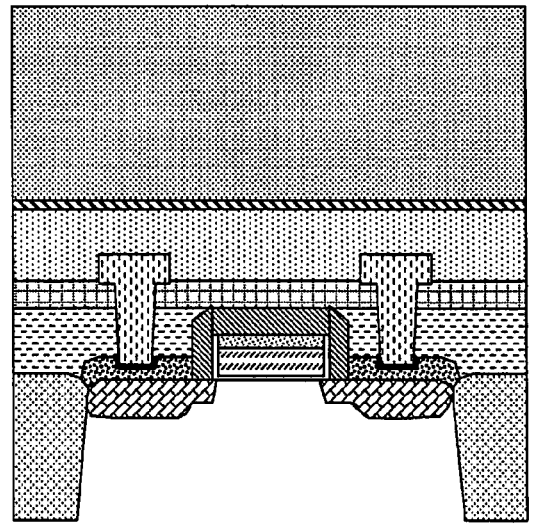

Further, a capacitor upper electrode 82 composed of a metal film of W, Ti, Pt, Ru or the like, a nitride film of any of these metals, or a laminated film thereof is formed on the memory cell region, as shown in FIG. 26A. Such a capacitor upper electrode 82 and a capacitor insulation film 81 are not left on the peripheral region, as shown in FIG. 26B.

As mentioned above, the trench gate Tr of the first embodiment has the first gate electrode 37' and the second gate electrode 40' formed in the inside of the groove. Specifically, the gate oxide film 36 is formed on the substrate within the groove while the first gate electrode 37' is formed only on a lower part of the groove with the gate oxide film 36 interposed between the substrate and the first gate electrode 37'.

Moreover, the groove side walls 39' are formed only on the inner walls of the upper part of the groove. Furthermore, the first gate electrode 37' is not present on the upper portion of the groove and the second gate electrode is formed to be in contact with the groove side walls 39' and to be connected to the top surface of the first gate electrode 37'. The channel portion of the Tr has a shape of a three-dimensional groove, whereby the effective distance between the source and the drain of the Tr is increased and thus the short-channel effects can be suppressed. The gate oxide film 36 and the first gate electrode 37' define the channel at the lower part of the groove while the groove side walls 39' are formed in the upper part of the groove to provide no channel. To this end, the second gate electrode 40' is surrounded by the gate oxide film 36 and the groove side wall 39'. This multilayered configuration of the gate oxide film 36 and the groove side wall 39' makes it possible to reduce the parasitic capacitance of the gate electrode. When the trench gate Tr of the present invention is used as a memory cell Tr, a DRAM cell having desirable device characteristics can be obtained, which is capable of suppressing the increase of the parasitic capacitance in word lines, and eliminating the deterioration in ON characteristics and increase in the chip size caused thereby.

Figures 27A, 27B:
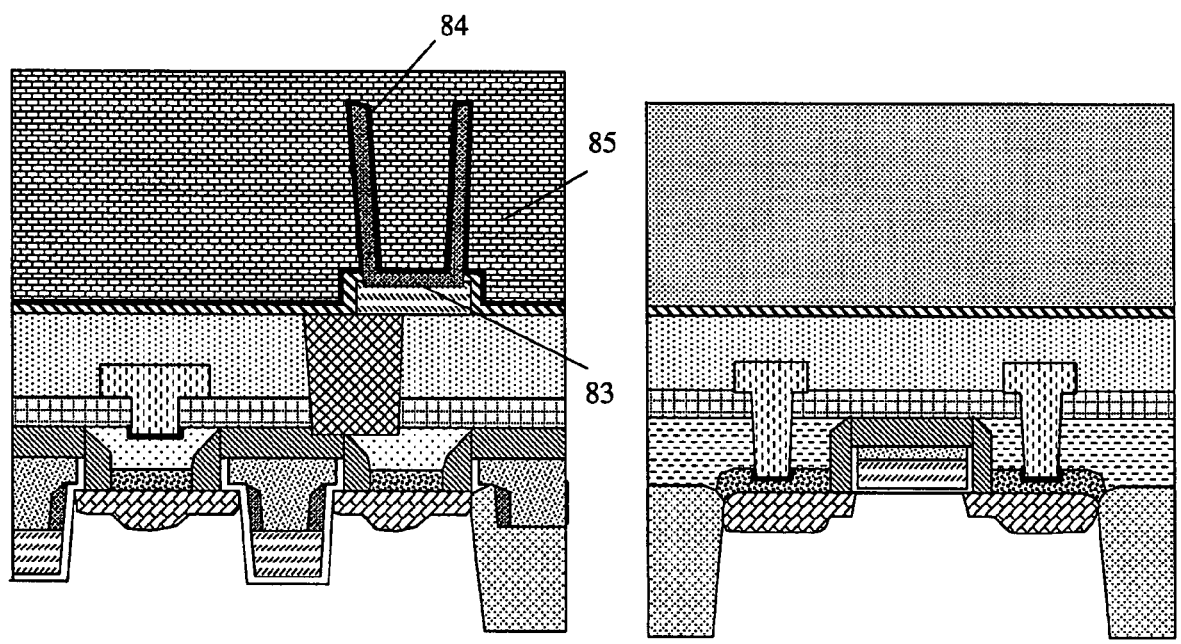
FIGS. 27A and 27B are cross-sectional views showing DRAM memory cell and a peripheral transistor, respectively, produced by a manufacture method according to a second embodiment of the present invention.

A description will be made about a second exemplary embodiment in which the capacitor lower electrode is formed in a cylindrical shape. FIGS. 27A and 27B are cross-sectional views showing the second embodiment. The process steps are the same as those of the first embodiment until the step shown in the cross-sectional views of FIGS. 25A and 25B. As shown in FIG. 25A, after formation of the capacitor lower electrode 80, the interlayer insulation film 78 is removed to form a cylindrical capacitor lower electrode 83. A capacitor insulation film 84 formed of $Ta_2O_5$, $Al_2O_3$, HfO or ZrO, or a laminated or mixed film thereof is deposited on the capacitor lower electrode 83. Further, a capacitor upper electrode 85 consisting of a metal film of W, Ti, Pt, Ru or the like, a nitride film of any of these metals, or a laminated film thereof is formed. According to the second exemplary embodiment, both sides of the walls of the capacitor lower electrode 83 can be utilized, and hence a large capacitance can be obtained.

A memory cell Tr according to the second exemplary embodiment is formed in a trench gate Tr structure. In a manner similar to the first exemplary embodiment, a DRAM cell having desirable device characteristics can be obtained, which is capable of suppressing the increase of the parasitic capacitance in word lines, and eliminating the deterioration in ON characteristics and increase in the chip size caused thereby.

Figure 28:
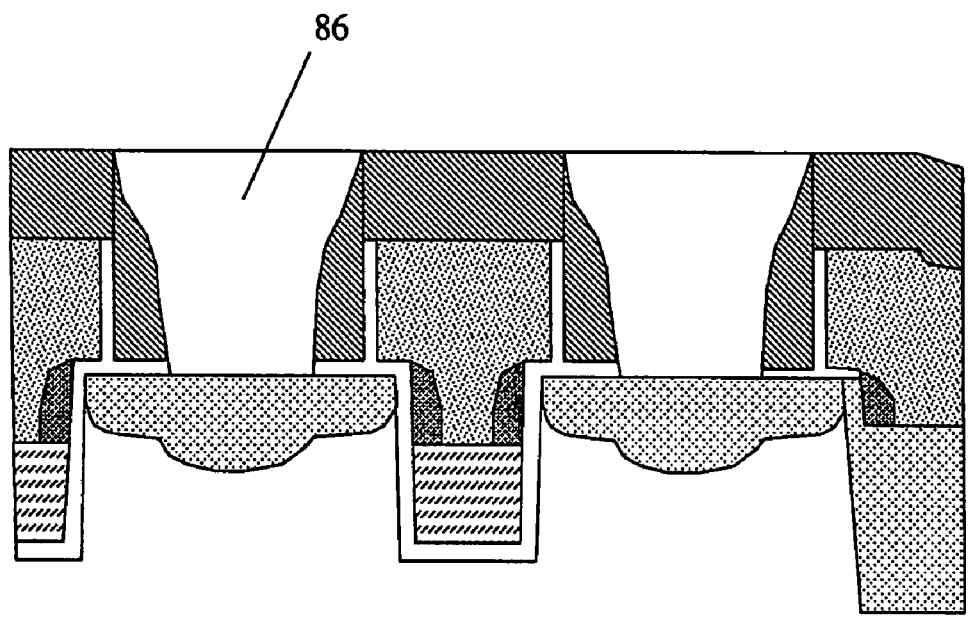
FIG. 28 is a cross-sectional view of a DRAM memory cell produced by a manufacture method according to a third embodiment.

A third exemplary embodiment of the present invention will be described with reference to FIG. 28. FIG. 28 is a cross-sectional view showing a substrate contact plug 86 formed in a memory cell. According to the third exemplary embodiment, a substrate contact in the memory cell is formed by the contact plug 86 of a silicon film which is in direct contact with the silicon substrate surface. In place of the lead-out electrode composed of the selective epitaxial layer and the contact plug in the first exemplary embodiment, the contact plug 86 formed of a silicon film doped with an impurity is used as a lead-out electrode. An interlayer insulation film is deposited without formation of a selective epitaxial layer, and a substrate contact is formed in the memory cell to form the contact plug 86. The source/drain impurity diffusion layer of the memory cell Tr is defined by a high-concentration impurity diffusion layer formed by impurity diffusion from the silicon film.

A memory cell Tr according to the third exemplary embodiment is formed in a trench gate Tr structure. In a manner similar to the other embodiments, a DRAM cell having desirable device characteristics can be obtained, which is capable of suppressing the increase of the parasitic capacitance in word lines, and eliminating the deterioration in ON characteristics and increase in the chip size caused thereby.

Figure 29:
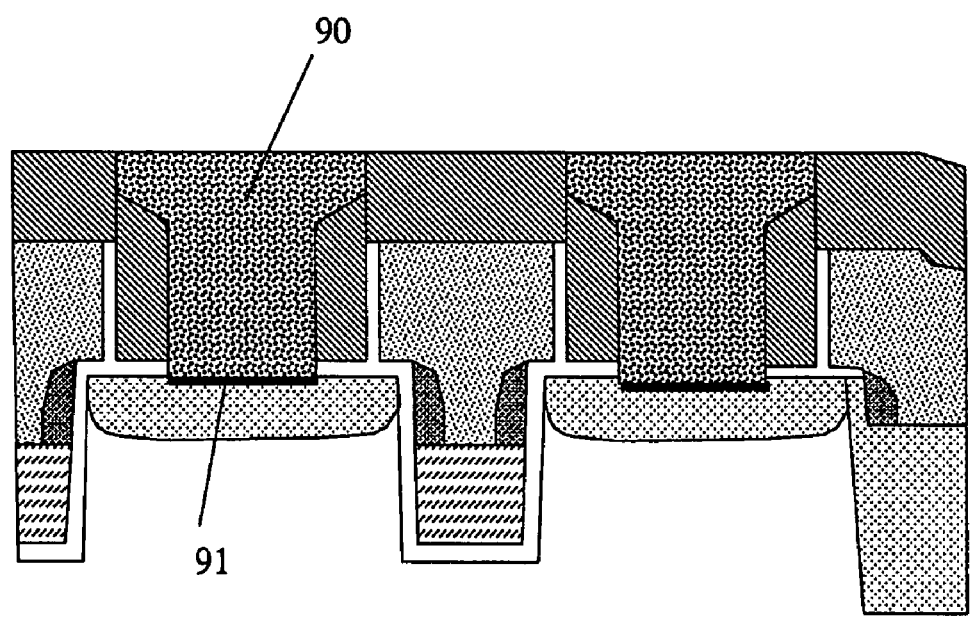
FIG. 29 is a cross-sectional view of a DRAM memory cell produced by a manufacture method according to a fourth embodiment fourth embodiment.

A fourth exemplary embodiment of the present invention will be described with reference to FIG. 29. FIG. 29 is a cross-sectional view showing a substrate contact plug formed in a memory cell. According to the fourth exemplary embodiment, a contact plug is formed by a metal plug 90. After formation of a substrate contact in the memory cell, the metal plug 90 is formed of W, Ti, TiN, or a laminated film thereof. The memory cell has a metal silicide film 91 of CoSi, WSi, TiSi or the like between the metal plug 90 and the substrate surface. Since the plug is formed of a metal, the contact resistance with the silicon substrate can be reduced. Since the contact resistance with the source/drain impurity diffusion layer can be reduced, no high-concentration impurity diffusion layer is formed in the memory cell Tr according to the fourth exemplary embodiment.

The memory cell Tr according to the fourth exemplary embodiment is formed in a trench gate Tr structure. In a manner similar to the other embodiments, a DRAM cell having desirable device characteristics can be obtained, which is capable of suppressing the increase of the parasitic capacitance in word lines and eliminating the deterioration in ON characteristics and increase in the chip size caused thereby.

A semiconductor device according to the present invention is structured by a trench gate Tr having the first gate electrode and the second gate electrode in the inside of a groove. The first gate electrode is provided in the lower part of the groove defining the Tr channel, with the gate oxide film interposed between the first gate electrode and the substrate. The top surface of the first gate electrode is located lower than the bottom surface of an impurity diffusion layer on the substrate interface, and higher than the distal end of a depletion layer formed in extension from the impurity diffusion layer. The second gate electrode is provided in the upper part of the groove facing the Tr impurity diffusion layer, with the gate oxide film and the groove side wall film interposed between the second gate electrode and the upper part of the groove. Thus, a composite film of the gate oxide film and the groove side wall are located between the gate electrode and the substrate in the upper part of the groove. Such an arrangement of the composite film is effective to reduce the parasitic capacitance of the gate electrode. Further, using the trench gate Tr according to the present invention as a DRAM memory cell Tr, device characteristics of the DRAM cell can be improved because the increase of the parasitic capacitance can be suppressed in word lines and deterioration in ON characteristics due to an increase in the chip size can be eliminated.

Although the present invention has been specifically described based on the preferred embodiments thereof, the present invention is not limited to these embodiments described above. Obviously, many modifications and variations are possible without departing from the scope of the invention and these modifications and variations also fall within the scope of the present invention.

What is claimed is:

1. A semiconductor device having a trench gate transistor comprising:

a groove formed in a semiconductor substrate;

a first gate electrode formed in a lower part of the groove with a gate insulation film interposed between the first gate electrode and the semiconductor substrate;

side walls which are provided on inner walls in an upper part of the groove located at a position higher than the first gate electrode and which have a bottom area larger than a top area thereof;

a second gate electrode formed so as to be in contact with the side walls and a part of the top surface of the first gate electrode;

a first diffusion layer which has a first impurity concentration, which is formed on opposite sides of said trench gate transistor, and which has a bottom portion higher than a top portion of said first gate electrode; and a second diffusion layer which has a second impurity concentration higher than the first impurity concentration, which is formed next to said first diffusion layer, and which has a bottom portion higher than a bottom portion of said first gate electrode.

2. The semiconductor device according to claim 1, wherein the side walls are formed along groove inner walls between the top surface of the first gate electrode and the substrate surface.

3. The semiconductor device according to claim 1, wherein the first gate electrode is formed of a silicon film doped with an impurity.

4. The semiconductor device according to claim 1, wherein the second gate electrode is formed of a conductive film including at least any one of a silicon film, a silicide film, a metal film, and a metal nitride film.

5. The semiconductor device according to claim 1, wherein the side walls are formed of an insulation film including at least one of a silicon oxide film, a silicon nitride film, and a silicon oxynitride film.

6. The semiconductor device according to claim 1, wherein the semiconductor device is a dynamic random access memory having the trench gate transistor used as a transfer gate transistor of a memory cell.

7. The semiconductor device according to claim 1, further comprising:
    a metal contact plug formed on opposite sides of the trench gate transistor, the metal contact plug being in direct contact with the semiconductor substrate.

8. The semiconductor device according to claim 1, wherein the first gate electrode is formed in a lower region of the groove defining a channel of the trench gate transistor.

9. The semiconductor device according to claim 8, wherein the top surface of the first gate electrode is located lower than the bottom surface of an impurity diffusion layer on the substrate interface and higher than the distal end of a depletion layer formed in extension from the impurity diffusion layer.

10. A manufacture method of a semiconductor device having a trench gate transistor comprising:
    forming a groove in a semiconductor substrate;
    forming a gate insulation film in the inside of the groove and on the semiconductor substrate;
    forming a first gate electrode in a lower part of the groove;
    forming side walls on the groove inner walls at a location higher than the first gate electrode, the side walls having a bottom area larger than a top area thereof;
    forming a second gate electrode so as to be in contact with the side walls and a part of the top surface of the first gate electrode;
    forming a first diffusion layer which has a first impurity concentration, which is formed on opposite sides of said trench gate transistor, and which has a bottom portion higher than a top portion of said first gate electrode; and
    forming a second diffusion layer which has a second impurity concentration higher than the first impurity concentration, and which has a bottom portion higher than a bottom portion of said first gate electrode.

11. The manufacture method of a semiconductor device according to claim 10, wherein the second gate electrode is formed of a conductive film including at least one of a silicon film, a silicide film, a metal film, and a metal nitride film.

12. The manufacture method of a semiconductor device according to claim 10, wherein the side walls are formed on an insulation film including at least one of a silicon oxide film, a silicon nitride film, and a silicon oxynitride film.

13. The manufacture method of a semiconductor device according to claim 10, wherein, in the step of forming the first gate electrode, a conductive film defining the electrode is etched away to leave a predetermined thickness of the film in the groove.

14. The manufacture method of a semiconductor device according to claim 13, wherein the first gate electrode is formed of a silicon film doped with an impurity.

15. The manufacture method of a semiconductor device according to claim 10, wherein the step of forming a first gate electrode comprises the steps of:
    depositing a gate oxide film on the groove;
    depositing a first gate conductive film with an impurity on the gate oxide film;
    coating a resist film on the first gate conductive film;
    selectively patterning the resist film;
    selectively and partially etching the first gate conductive film by plasma dry etching while leaving the resist film on a peripheral region.

16. The manufacture method of a semiconductor device according to claim 15, wherein the step of forming side walls on the groove inner walls comprises the steps of:
    forming an insulation film including at least one of a silicon oxide film, a silicon nitride film, and a silicon oxynitride film on the semiconductor substrate, to thereby form an groove side wall film; and
    subjecting the groove side wall film to anisotropic dry etching by RIE, to thereby form the groove side walls on upper inner walls of the groove where the first gate electrode is not formed.

* * * * *